(12) United States Patent  
Satake

(10) Patent No.: US 9,236,907 B2  
(45) Date of Patent: Jan. 12, 2016

(54) LAMINATE-TYPE ELECTRONIC DEVICE WITH FILTER AND BALUN

(75) Inventor: Hirotaka Satake, Tottori (JP)

(73) Assignee: HITACHI METALS, LTD., Tokyo (JP)

( * ) Notice: Subject to any disclaimer, the term of this patent is extended or adjusted under 35 U.S.C. 154(b) by 166 days.

(21) Appl. No.: 13/822,542

(22) PCT Filed: Sep. 12, 2011

(86) PCT No.: PCT/JP2011/070762  
§ 371 (c)(1),  
(2), (4) Date: Apr. 4, 2013

(87) PCT Pub. No.: WO2012/036134  
PCT Pub. Date: Mar. 22, 2012

(65) Prior Publication Data  
US 2013/0200958 A1    Aug. 8, 2013

(30) Foreign Application Priority Data

Sep. 14, 2010   (JP) .................................. 2010-205526

(51) Int. Cl.  
*H03H 7/09* (2006.01)  
*H04B 3/32* (2006.01)  
(Continued)

(52) U.S. Cl.  
CPC ............... *H04B 3/32* (2013.01); *H03H 7/0123* (2013.01); *H03H 7/0161* (2013.01); *H03H 7/09* (2013.01);  
(Continued)

(58) Field of Classification Search  
USPC ............................................. 333/26, 25, 204  
See application file for complete search history.

(56) References Cited

U.S. PATENT DOCUMENTS 5,450,046 A * 9/1995 Kosugi et al. ................. 333/246  
5,668,511 A * 9/1997 Furutani et al. ............... 333/204  
(Continued)

FOREIGN PATENT DOCUMENTS

JP    09-135140 A    5/1997  
JP    11-145771 A    5/1999  
(Continued)

OTHER PUBLICATIONS

Communication dated Apr. 14, 2015 from the Japanese Patent Office in counterpart application No. 2012-534000.

*Primary Examiner* — Thomas J Hiltunen  
(74) *Attorney, Agent, or Firm* — Sughrue Mion, PLLC

(57) ABSTRACT

An electronic device comprising a laminate constituted by pluralities of insulation layers on which conductor patterns are formed; ground electrodes being formed on an upper-surface-side insulation layer and a bottom-surface-side insulation layer in the laminate; the laminate being partitioned to first and second regions by a first shield constituted by a line of via-holes electrically connecting the upper-surface-side ground electrode to the bottom-surface-side ground electrode; conductor patterns constituting a first filter for a first frequency band and conductor patterns constituting a first balun for the first frequency band being arranged in the first and second regions, respectively; pluralities of terminal electrodes being formed on bottom or side surfaces of the laminate; one of terminal electrodes of the first filter, which acts as an unbalanced port, being adjacent to a terminal electrode of the first balun, which acts as an unbalanced port, with no other terminal electrode than a ground electrode existing therebetween; and the first filter and the first balun being not electrically connected.

3 Claims, 16 Drawing Sheets

(51) Int. Cl.
  *H03H 7/01* (2006.01)
  *H03H 7/42* (2006.01)
  *H03H 7/46* (2006.01)
  *H03H 1/00* (2006.01)

(52) U.S. Cl.
  CPC ........... *H03H 7/1708* (2013.01); *H03H 7/1775* (2013.01); *H03H 7/42* (2013.01); *H03H 7/422* (2013.01); *H03H 7/463* (2013.01); *H03H 2001/0085* (2013.01)

(56) References Cited

U.S. PATENT DOCUMENTS

| | | | |
|---|---|---|---|
| 6,249,194 B1 | 6/2001 | Watanabe et al. | |
| 6,294,976 B1 * | 9/2001 | Imada et al. | 336/200 |
| 6,828,881 B2 * | 12/2004 | Mizutani et al. | 333/204 |
| 6,850,127 B2 * | 2/2005 | Sakakura et al. | 333/25 |
| 7,023,301 B2 | 4/2006 | Kawahara et al. | |
| 7,256,663 B2 * | 8/2007 | Yasuda et al. | 333/26 |
| 7,565,116 B2 | 7/2009 | Okuyama et al. | |
| 7,663,448 B2 * | 2/2010 | Harada et al. | 333/26 |
| 7,800,465 B2 * | 9/2010 | Kimura et al. | 333/204 |
| 7,825,746 B2 * | 11/2010 | Yeung et al. | 333/185 |
| 8,013,688 B2 * | 9/2011 | White et al. | 333/134 |
| 8,797,117 B2 * | 8/2014 | Shimakawa | 333/25 |
| 2002/0175002 A1 | 11/2002 | Sakakura et al. | |
| 2002/0180561 A1 | 12/2002 | Kawahara et al. | |
| 2003/0025571 A1 * | 2/2003 | Maekawa et al. | 333/26 |
| 2006/0022773 A1 * | 2/2006 | Iwasaki et al. | 333/204 |
| 2006/0117163 A1 | 6/2006 | Okuyama et al. | |
| 2006/0125589 A1 | 6/2006 | Tamata et al. | |
| 2009/0134950 A1 | 5/2009 | Kimura et al. | |
| 2013/0250536 A1 * | 9/2013 | Satake | 361/783 |

FOREIGN PATENT DOCUMENTS

| | | |
|---|---|---|
| JP | 2000-91751 A | 3/2000 |
| JP | 2000-357932 A | 12/2000 |
| JP | 2003-018039 A | 1/2003 |
| JP | 2003-46358 A | 2/2003 |
| JP | 2003-060462 A | 2/2003 |
| JP | 2003-258585 A | 9/2003 |
| JP | 2003-273686 A | 9/2003 |
| JP | 2003-283285 A | 10/2003 |
| JP | 2006-140862 A | 6/2006 |
| JP | 2006-173145 A | 6/2006 |
| JP | 2007-104102 A | 4/2007 |

\* cited by examiner

LAMINATE-TYPE ELECTRONIC DEVICE WITH FILTER AND BALUN

CROSS REFERENCE TO RELATED APPLICATIONS

This application is a National Stage of International Application No. PCT/JP2011/070762, filed on Sep. 12, 2011, the contents of which are incorporated herein by reference in their entirety.

FIELD OF THE INVENTION

The present invention relates to an electronic device for wireless communications apparatuses, which comprises a filter and a balun in such a manner as to prevent interference even when it is miniaturized.

BACKGROUND OF THE INVENTION

The miniaturization of wireless communications apparatuses such as mobile phones, etc. has resulted in rapid miniaturization of electronic devices used therein. FIG. 25 shows a high-frequency circuit for wireless communications apparatuses for wireless LAN (local area network). This high-frequency circuit comprises a high-frequency switch SW connected to an antenna ANT for switching connection to a transmission circuit Tx and a receiving circuit Rx; a filter FIL2, an amplifier PA, a filter FIL1 and a balun BAL1 being connected in this order from the antenna ANT in a pass for transmission signals of a frequency f1, and a filter FIL4, a low-noise amplifier LNA, a filter FIL3 and a balun BAL2 being connected in this order from the antenna ANT in a pass for reception signals of a frequency f2. Used in the transmission circuit Tx and the receiving circuit Rx in such high-frequency circuit are semiconductor devices IC handling balanced signals highly resistant to noises. Also, because the input/output impedance of a semiconductor device IC may be different from those of other circuit devices, baluns are sometimes needed for conversion between balanced signals and unbalanced signals, and for impedance conversion.

JP 2003-018039 A discloses an RF module comprising a switch circuit disposed between a transmission circuit and a receiving circuit and an antenna for controlling connection between the transmission circuit and the antenna and connection between the receiving circuit and the antenna, and a first balanced-unbalanced circuit disposed between the switch circuit and the transmission circuit; the first balanced-unbalanced circuit being a balun transformer comprising a first transmission line, and second and third transmission lines electromagnetically coupled to the first transmission line; the first transmission line having one end connected to an unbalanced terminal, and the other end which is grounded or open; the second transmission line having one end grounded, and the other end connected to the first balanced terminal; the third transmission line having one end grounded, the other end connected to the second balanced terminal; and a balun transformer constituting the first balanced-unbalanced circuit having second and third transmission lines whose ends are connected and grounded via a capacitor. Transmission lines and capacitors constituting the filters, the balun transformer and the switch circuit are formed on dielectric layers constituting a laminate, and passive devices not contained in the laminate, and active devices such as diodes, GaAs FET, RFIC, etc. are mounted on an upper surface of the laminate.

JP 2003-258585 A discloses, as shown in FIG. 26, a laminate-type electronic device comprising a filter and a balun contained in a laminate of insulation layers 310A-310J having conductor patterns 330-390, the filter and the balun being laterally displaced to avoid overlapping, and connected between an unbalanced terminal and a pair of balanced terminals.

The production of a small electronic device having pluralities of circuit functions with a laminate suffers some problems. The first problem is that because electronic devices having various circuit functions cannot be used in common applications, high-frequency circuits for which they can be used are restricted. For example, when various circuit blocks described in JP 2003-018039 A are produced, electronic devices adapted to them are needed, making it difficult to provide commonly usable electronic devices. The costs of industrial products generally decrease as their numbers increase, but conventional electronic devices cannot be produced at low cost because they are not usable for common applications. Also, once circuit specifications are changed, electronic devices adapted to them should be redesigned from scratch.

The second problem is the deterioration of characteristics by electromagnetic interference between pluralities of circuits. In JP 2003-258585 A, conductor patterns constituting a bandpass filter and those constituting a balun are formed on insulation layers with lateral displacement, to avoid overlapping between the bandpass filter and the balun in a lamination direction. However, the size reduction of electronic devices makes a bandpass filter closer to a balun in the laminate, making it difficult to arrange them so separately as to avoid interference.

OBJECT OF THE INVENTION

Accordingly, an object of the present invention is to provide an electronic device having excellent electric characteristics, which is commonly usable in various high-frequency circuits, and comprises a filter and a balun without interference even when miniaturized.

SUMMARY OF THE INVENTION

The first electronic device of the present invention comprises a laminate constituted by pluralities of insulation layers on which conductor patterns are formed;

a ground electrode being formed on each of an upper-surface-side insulation layer and a bottom-surface-side insulation layer in the laminate;

the laminate being partitioned in a planar direction to first and second regions between the upper-surface-side ground electrode and the bottom-surface-side ground electrode, by a first shield constituted by a line of via-holes formed in a lamination direction to electrically connect the upper-surface-side ground electrode to the bottom-surface-side ground electrode;

conductor patterns constituting a first filter for a first frequency band being arranged in the first region;

conductor patterns constituting a first balun for the first frequency band being arranged in the second region;

pluralities of terminal electrodes being formed on bottom or side surfaces of the laminate;

one of terminal electrodes of the first filter, which acts as an unbalanced port, being arranged adjacently to a terminal electrode of the first balun, which acts as an unbalanced port, with no other terminal electrode than a ground electrode existing therebetween; and the first filter and the first balun being not electrically connected in the laminate.

The second electronic device of the present invention comprises, in addition to the structure of the first electronic device;

a second shield crossing the first shield, the second shield being constituted by a line of via-holes formed in a lamination direction to electrically connect the upper-surface-side ground electrode to the bottom-surface-side ground electrode;

the laminate being partitioned to first to fourth regions in planar directions by the first and second shields between the upper-surface-side ground electrode and the bottom-surface-side ground electrode;

conductor patterns constituting a first filter for a first frequency band being arranged in the first region;

conductor patterns constituting a first balun for the first frequency band being arranged in the second region;

conductor patterns constituting a second filter for a second frequency band being arranged in the third region;

conductor patterns constituting a second balun for the second frequency band being arranged in the fourth region;

one of terminal electrodes of the second filter, which acts as an unbalanced port, being arranged adjacently to a terminal electrode of the second balun, which acts as an unbalanced port, with no other terminal electrode than a ground electrode existing therebetween; and the first filter, the first balun, the second filter and the second balun being not electrically connected in the laminate.

The third electronic device of the present invention comprises, in addition to the structure of the second electronic device;

a third shield crossing the second shield, the third shield being constituted by a line of via-holes formed in a lamination direction to electrically connect the upper-surface-side ground electrode to the bottom-surface-side ground electrode;

the laminate being partitioned to first to sixth regions in planar directions by the first to third shields between the upper-surface-side ground electrode and the bottom-surface-side ground electrode;

conductor patterns constituting a first filter for a first frequency band being arranged in the first region;

conductor patterns constituting a first balun for the first frequency band being arranged in the second region;

conductor patterns constituting a second filter for a second frequency band being arranged in the third region;

conductor patterns constituting a second balun for the second frequency band being arranged in the fourth region;

conductor patterns constituting a third filter for the first frequency band being arranged in the fifth region;

conductor patterns constituting a fourth filter for the second frequency band being arranged in the sixth region; and the first filter, the first balun, the second filter, the second balun, the third filter and the fourth filter being not electrically connected in the laminate.

In the first electronic device, it is preferable that pluralities of terminal electrodes are formed on upper and bottom surfaces of the laminate, and that another unbalanced port of the first filter is connected to a terminal electrode on an upper or bottom surface. In the second electronic device, another unbalanced port of each of the first and second filters is preferably connected to a terminal electrode on an upper or bottom surface.

In the third electronic device, it is preferable that pluralities of terminal electrodes are formed on upper and bottom surfaces of the laminate, and that another unbalanced port of the first filter, another unbalanced port of the second filter, two unbalanced ports of the third filter and two unbalanced ports of the fourth filter are connected to terminal electrodes on an upper or bottom surface.

Also, in the third electronic device, with at least part of via-holes constituting the third shield extending from the upper surface to the bottom surface in the laminate, and with an amplifier arranged in a portion on the upper surface of the laminate in which the amplifier overlaps the third shield, the third shield can act as a heat-dissipating pass for the amplifier.

In the first to third electronic devices, a high-frequency amplifier is preferably arranged on an upper surface of the laminate.

The fourth electronic device of the present invention comprises a laminate constituted by pluralities of insulation layers on which conductor patterns are formed;

a ground electrode being formed on each of an upper-surface-side insulation layer and a bottom-surface-side insulation layer in the laminate;

the laminate being partitioned to first and second regions in a lamination direction between the upper-surface-side ground electrode and the bottom-surface-side ground electrode, by a first shield constituted by a ground electrode formed on an insulation layer between the upper-surface-side ground electrode and the bottom-surface-side ground electrode;

conductor patterns constituting a first filter for a first frequency band being arranged in the first region;

conductor patterns constituting a first balun for the first frequency band being arranged in the second region;

pluralities of terminal electrodes being formed on bottom or side surfaces of the laminate;

one of terminal electrodes of the first filter, which acts as an unbalanced port, being arranged adjacently to a terminal electrode of the first balun, which acts as an unbalanced port, with no other terminal electrode than a ground electrode existing therebetween; and the first filter and the first balun being not electrically connected in the laminate.

The fifth electronic device of the present invention comprises, in addition to the structure of the fourth electronic device;

a second shield constituted by a line of via-holes formed in a lamination direction to electrically connect the upper-surface-side ground electrode, the bottom-surface-side ground electrode and the first shield;

the laminate being partitioned to first to fourth regions in plane and lamination directions by the first and second shields between the upper-surface-side ground electrode and the bottom-surface-side ground electrode;

conductor patterns constituting a first filter for a first frequency band being arranged in the first region;

conductor patterns constituting a first balun for the first frequency band being arranged in the second region;

conductor patterns constituting a second filter for a second frequency band being arranged in the third region;

conductor patterns constituting a second balun for the second frequency band being arranged in the fourth region;

one of terminal electrodes of the second filter, which acts as an unbalanced port, being arranged adjacently to a terminal electrode of the second balun, which acts as an unbalanced port, with no other terminal electrode than a ground electrode existing therebetween; and the first filter, the first balun, the second filter and the second balun being not electrically connected in the laminate.

In the fourth electronic device, it is preferable that pluralities of terminal electrodes are formed on upper and bottom surfaces of the laminate, and that another unbalanced port of the first filter is connected to a terminal electrode on an upper or bottom surface. Also, in the fifth electronic device, another unbalanced port of each of the first and second filters is preferably connected to a terminal electrode on an upper or bottom surface.

In the fourth and fifth electronic devices, a high-frequency amplifier is preferably arranged on an upper surface of the laminate.

BRIEF DESCRIPTION OF THE DRAWINGS

FIG. 7($b$) is an exploded cross-sectional view taken along the line A-A in FIG. 7($a$).

FIG. 24($b$) is a block diagram showing the structure modified of the high-frequency circuit shown in FIG. 24($a$), in which a filter terminal is directly connected to a balun terminal.

FIG. 24($c$) is a block diagram showing the structure modified of the high-frequency circuit shown in FIG. 24($a$), in which a filter terminal is connected to a balun terminal via a notch filter.

FIG. 24($d$) is a block diagram showing the structure modified of the high-frequency circuit shown in FIG. 24($a$), in which a filter terminal is connected to a balun terminal via a lowpass filter.

FIG. 24($e$) is a block diagram showing the structure modified of the high-frequency circuit shown in FIG. 24($a$), in which a filter terminal is connected to a balun terminal via a highpass filter.

DESCRIPTION OF THE PREFERRED EMBODIMENTS

Figure 1:
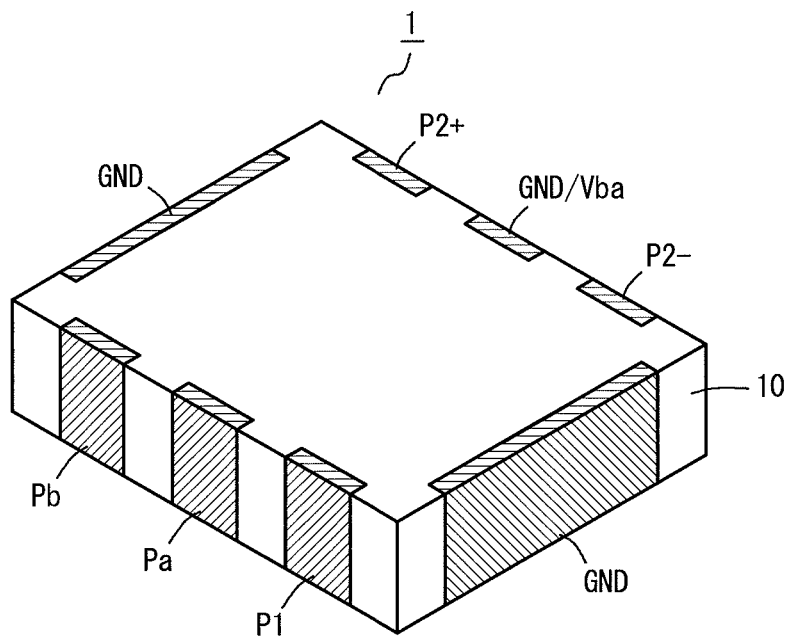
FIG. 1 is a perspective view showing the appearance of an electronic device according to one embodiment of the present invention.

Preferred embodiments of the present invention will be explained in detail below referring to the drawings. Explanations of one embodiment are applicable to other embodiments unless otherwise mentioned.

Figure 2:
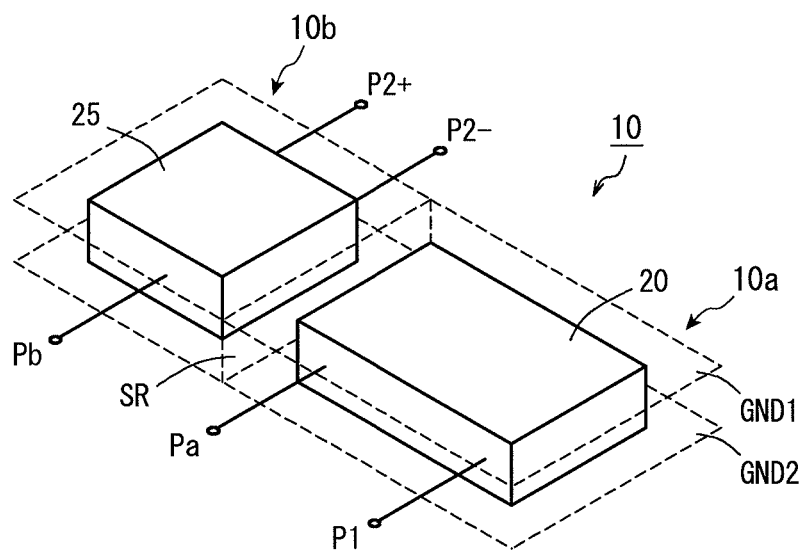
FIG. 2 is a perspective view showing one example of the arrangements of a filter and a balun in a laminate constituting the electronic device according to one embodiment of the present invention.
Figure 3:
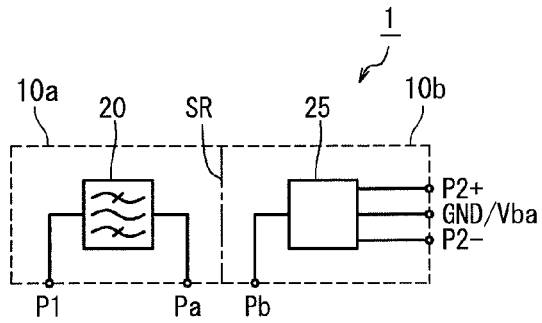
FIG. 3 is a block diagram showing the circuit of the electronic device according to one embodiment of the present invention.

FIG. 1 shows the appearance of an electronic device 1 according to one embodiment of the present invention, FIG. 2 shows the arrangement of a filter 20 and a balun 25 in the electronic device 1, and FIG. 3 shows its circuit. A laminate 10 constituting the electronic device 1 is partitioned in a planar direction to pluralities of electromagnetically shielded regions 10$a$, 10$b$ by pluralities of ground electrodes GND1, GND2 at different lamination positions, and a shield SR electrically connecting the ground electrodes GND1, GND2; conductor patterns constituting a first filter 20 being arranged in a first region 10$a$, and conductor patterns constituting a first balun 25 being arranged in a second region 10$b$ different from the region 10$a$. With each region 10$a$, 10$b$ shielded, the filter 20 and the balun 25 are free from noises from other circuits.

A pair of input and output ports P1, Pa of the filter 20 are unbalanced ports. Among a pair of input and output ports Pb, P2+, P2− of the balun 25, the input port Pb is an unbalanced port, and the output ports P2+, P2− are balanced ports. In each circuit explained below, one port is an input port, while the other port is an output port, though not restrictive.

Figure 4:
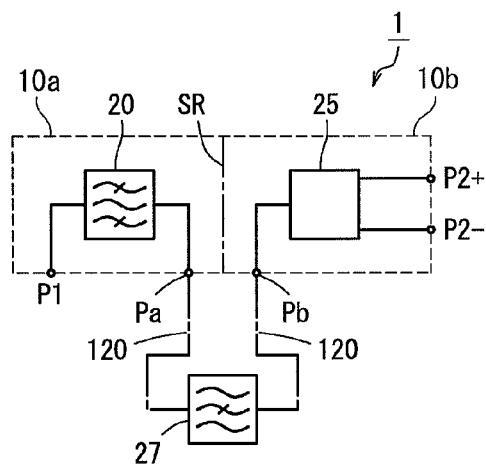
FIG. 4 is a block diagram showing one example of the connections of a filter to a balun in the electronic device according to one embodiment of the present invention.
Figure 5:
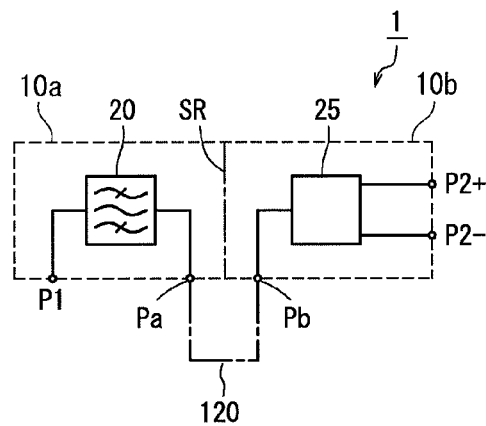
FIG. 5 is a block diagram showing another example of the connections of a filter to a balun in the electronic device according to one embodiment of the present invention.

In the electronic device of the present invention 1, the filter 20 and the balun 25 are not connected in the laminate 10, but the input port P1 and output port Pa of the filter 20 and the input port Pb and output ports P2+/P2− of the balun 25 are respectively connected to terminal electrodes formed on an outer surface of the laminate. Thus, for example, when the electronic device 1 of the present invention is mounted to a circuit board (not shown), the filter 20 and the balun 25 may be connected via another circuit device 27 (a notch filter in this example) and connecting lines 120, 120 on the circuit board as shown in FIG. 4. Also, as shown in FIG. 5, the filter 20 and the balun 25 may be connected via a connection line 120 or a connection pad (not shown) on the circuit board. Alternatively, the filter 20 and the balun 25 may be used alone. Accordingly, one electronic device can be used in four ways.

Figure 6:
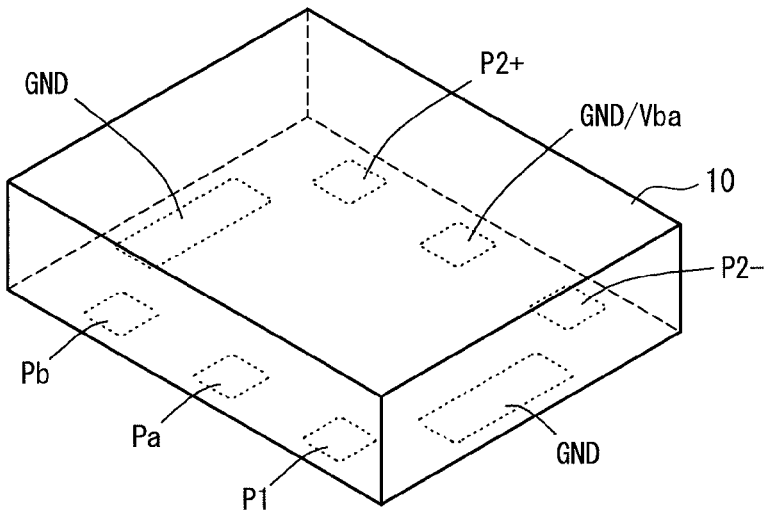
FIG. 6 is a perspective view showing the arrangement of terminal electrodes in a laminate constituting the electronic device according to one embodiment of the present invention.

The terminal electrodes may be of a side surface electrode structure shown in FIG. 1 or a bottom surface electrode structure shown in FIG. 6. In the case of the bottom surface electrode structure, internal conductor patterns are connected to the terminal electrodes through via-holes in the laminate 10, so that electrodes are not exposed on the side surfaces. Accordingly, the electronic device 1 can be arranged near other circuit devices on a mounting board, resulting in a reduced RF circuit area on the board. Also, the bottom surface electrode structure is likely free from electromagnetic interference with other circuit devices.

Symbols attached to the terminal electrodes in FIGS. 1 and 6 correspond to the input port P1 and output port Pa of the filter 20, the input port Pb and output (balanced) ports P2+, P2− of the balun 25, ground ports GND, and a DC-voltage-inputting port GND/Vba in FIG. 3.

Figure 7A:
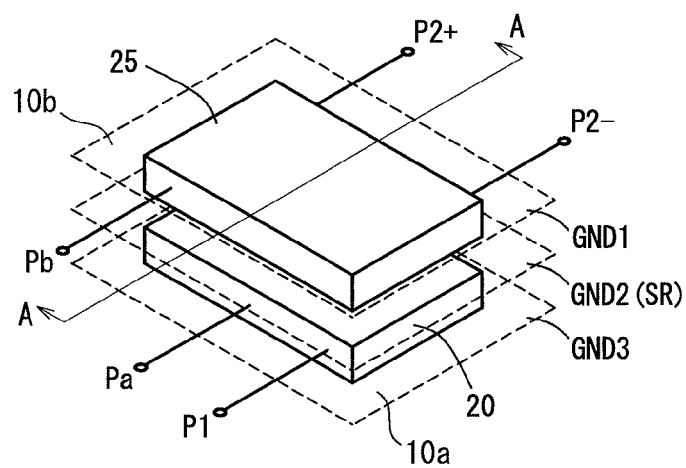
FIG. 7($a$) is a perspective view showing another example of the arrangements of a filter and a balun in a laminate constituting an electronic device according to another embodiment of the present invention.
Figure 7B:
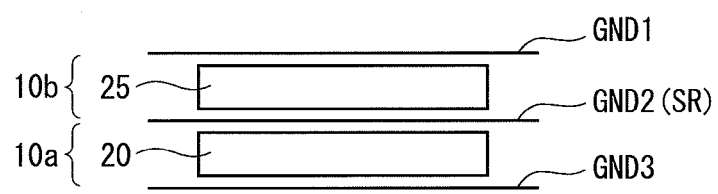

Though the filter 20 and the balun 25 are arranged in the laminate 10 without overlapping in a lamination direction in the example shown in FIG. 2, the filter 20 and the balun 25 may be arranged in a lamination (vertical) direction as shown in FIGS. 7(a) and 7(b). In this case, the laminate 10 is partitioned to upper and lower regions 10a, 10b by an intermediate ground electrode GND2 functioning as a shield SR between the upper-surface-side ground electrode GND1 and the bottom-surface-side ground electrode GND3, the filter 20 being arranged in the first region 10a, and the balun 25 being arranged in the second region 10b.

Figure 8:
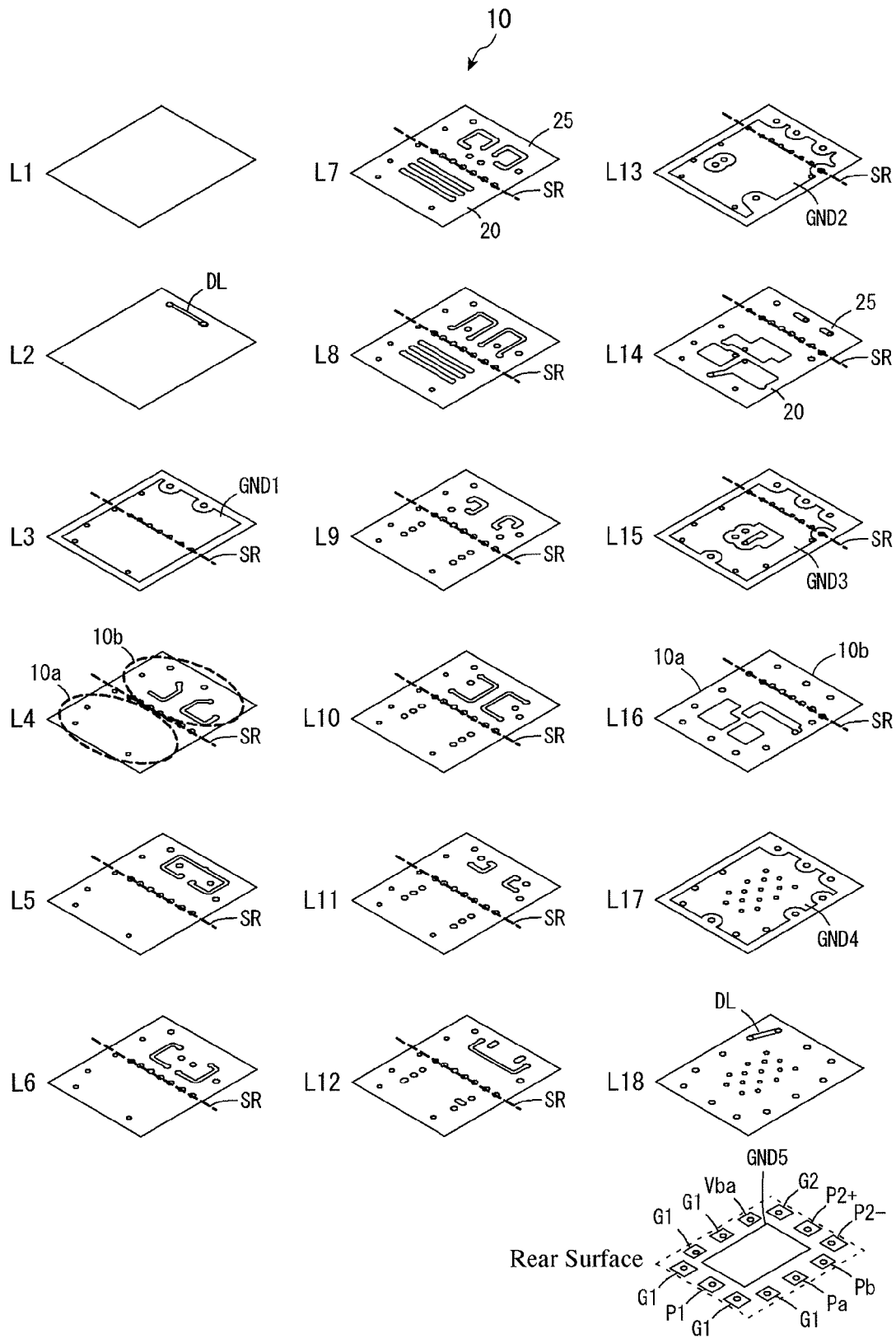
FIG. 8 is an exploded perspective view showing the internal structure of a laminate constituting the electronic device according to one embodiment of the present invention.

FIG. 8 shows the internal structure of the laminate 10 comprising 18 insulation layers L1-L18 for constituting the electronic device 1 shown in FIG. 3. The laminate 10 is partitioned to two regions 10a, 10b by a shield SR; the filter 20 being arranged in the first region 10a, and the balun 25 being arranged in the second region 10b. A ceramic green sheet constituting each insulation layer is provided with conductor patterns and via-holes, and pluralities of green sheets are integrally laminated and sintered to a ceramic substrate (laminate) 10. Also, the laminate may be composed of insulating resin layers by resin lamination technologies.

Pluralities of terminal electrodes formed on a periphery of a rear surface of the lowermost insulation layer L18 are connected to conductor patterns on upper layers through via-holes. A ground pad GND5 connected to ground electrodes on upper layers through via-holes is provided in a center region separate from each terminal electrode. The ground pad GND5 provides a stable ground potential and improved connection strength to the circuit board.

As shown in FIG. 8, the terminal electrodes comprise the input port P1 and output port Pa of the filter 20, the input port Pb and output (balanced) ports P2+, P2− of the balun 25, ground ports G1, a port Vba to which DC voltage is input, and a port G2 grounded via a capacitor on the circuit board. The input port P1 and the output ports P2+, P2− are arranged on different side surfaces (opposing side surfaces in the example shown in FIG. 8). The output port Pa and the input port Pb are adjacently arranged on a side surface (adjacent side surface) different from the side surface on which the output ports P2+, P2− are arranged. The ground ports G1 are connected to ground electrodes on upper layers together with the ground pad GND5. A line DL connecting the port Vba to the port G2 is formed on an upper surface of the insulation layer L18.

When DC voltage need not be input, either one of the port Vba and the port G2 is connected to the ground of the circuit board, with the other unconnected. Of course, both may be connected to the ground.

An almost entire surface of an insulation layer L17 is occupied with a ground electrode GND4, whose center portion is provided with via-holes for connection to the ground pad GND5, and via-holes formed outside the ground electrode GND4 for connection to the ground ports G1. A periphery of the ground pad GND5 is located inside the ground electrode GND4.

Formed on an insulation layer L16 are a line of via-holes for constituting the shield SR, by which the region 10a and the region 10b are partitioned in a planar direction. Conductor patterns for capacitors in the filter 20 are formed in the region 10a, and via-holes for connecting conductor patterns constituting the balun 25 on upper layers to the output ports P2+, P2− and the port G2 are formed in the region 10b.

Formed on an insulation layer L15 are a line of via-holes for constituting the shield SR, by which the region 10a and the region 10b are partitioned, and a ground electrode GND3 covering an almost entire surface of the layer L15. Conductor patterns for capacitors in the filter 20 are formed in the region 10a, and via-holes for connecting conductor patterns constituting the balun 25 on upper layers to the output ports P2+, P2− and the port G2 are formed in the region 10b.

Formed on an insulation layer L14 are a line of via-holes for constituting the shield SR, by which the region 10a and the region 10b are partitioned. Conductor patterns for capacitors in the filter 20 are formed in the region 10a, and via-holes for connecting conductor patterns constituting the balun 25 on upper layers to the output ports P2+, P2− and the port G2 are formed in the region 10b.

Formed on an insulation layer L13 are a line of via-holes for constituting the shield SR, by which the region 10a and the region 10b are partitioned, and a ground electrode GND2 covering an almost entire surface of the layer L13. Formed in the region 10b are via-holes for connecting conductor patterns constituting the balun 25 on upper layers to the output ports P2+, P2− and the port G2.

Formed on insulation layers L4-L12 are lines of via-holes for constituting the shield SR, by which the region 10a and the region 10b are partitioned. Conductor patterns for resonator lines in the filter 20 are formed in the region 10a, and conductor patterns for inductors in the balun 25 are formed in the region 10b.

Formed on an insulation layer L3 are a line of via-holes for constituting the shield SR, and a ground electrode GND1 covering an almost entire surface of the layer L3.

Figure 20:
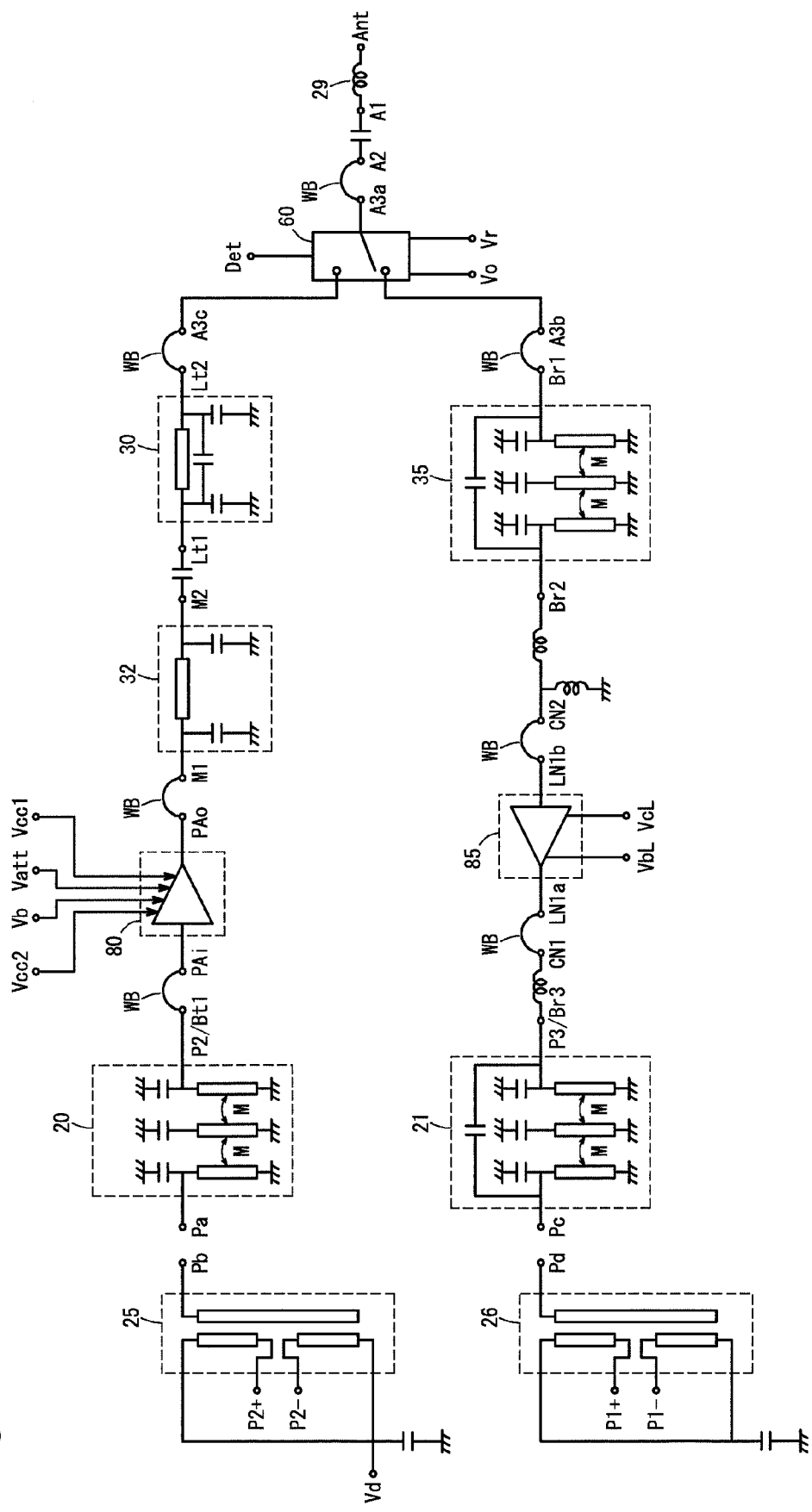
FIG. 20 is a block diagram showing one example of the circuits of the electronic device shown in FIG. 19.

Formed on an insulation layer L2 is a line DL connecting the port Vba to conductor lines constituting the balun 25. Nothing is formed on an insulation layer L1. The filter 20 and the balun 25 thus obtained have the same equivalent circuits as shown in FIG. 20.

With the ground electrodes GND1-GND4 connected through pluralities of via-holes, a stable ground potential is obtained in the laminate 10. The region 10a having conductor patterns for the filter 20 and the region 10b having conductor patterns for the balun 25 are partitioned by the shield SR and the ground electrodes to prevent electromagnetic interference. In the electronic device in this example, a lines-forming region and a capacitors-forming region are separated, with shields SR formed at different positions in these regions. With different area ratios of the region 10a to the region 10b in the insulation layers, a region necessary for forming capacitors for the filter 20 are secured in a limited area.

Because electromagnetic interference is smaller between electrode patterns for capacitors than between those constituting lines in the same plane, a shield SR may be omitted in a capacitor-forming region. For example, when only via-holes for connecting conductor patterns for the balun 25 are formed on the same insulation layer as that on which capacitors for the filter 20 are formed, a shield SR may be omitted.

Figure 9:
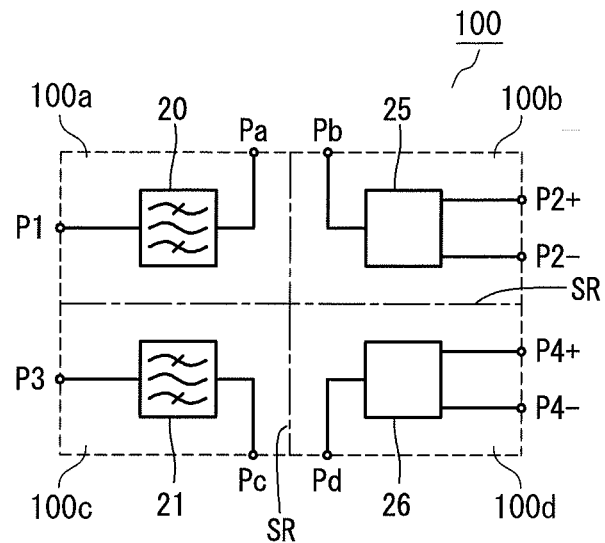
FIG. 9 is a block diagram showing the circuit of an electronic device according to a further embodiment of the present invention.

FIG. 9 shows the circuit of an electronic device, in which a laminate 100 is partitioned by first and second perpendicular shields SR, SR to four regions 100a, 100b, 100c, 100d in planar directions, so that it can handle first and second frequency bands. Conductor patterns constituting a first filter 20 for a first frequency band are formed in the first region 100a, conductor patterns constituting a first balun 25 for a first frequency band are formed in the second region 100b, conductor patterns constituting a second filter 21 for a second frequency band are formed in the third region 100c, and conductor patterns constituting a second balun 26 for a second frequency band are formed in the fourth region 100d.

It is preferable that a terminal electrode acting as one unbalanced port Pa of the first filter 20 is directly (via no other terminal electrodes except for ground electrodes) adjacent to a terminal electrode acting as an unbalanced port Pb of the first balun 25, while a terminal electrode acting as one unbalanced port Pc of the second filter 21 is directly (via no other terminal electrodes except for ground electrodes) adjacent to a terminal electrode acting as an unbalanced port Pd of the second balun 26. The first filter 20, the first balun 25, the second filter 21 and the second balun 26 are not electrically connected to each other in the laminate 100.

It is preferable that another unbalanced port P1 of the first filter 20 is aligned to another unbalanced port P3 of the second filter 21 on the same side surface of the laminate 100, and that balanced ports P2+, P2− of the first balun 25 and balanced ports P4+, P4− of the second balun 26 are aligned on a side surface different from that of the unbalanced ports P1, P3 (on an opposing side surface in the example shown in FIG. 9). It is also possible that the unbalanced port P1 and the unbalanced port Pa, Pb are formed on the same side surface, while the unbalanced port P3 and the unbalanced ports Pc, Pd are formed on the same side surface.

Figure 10:
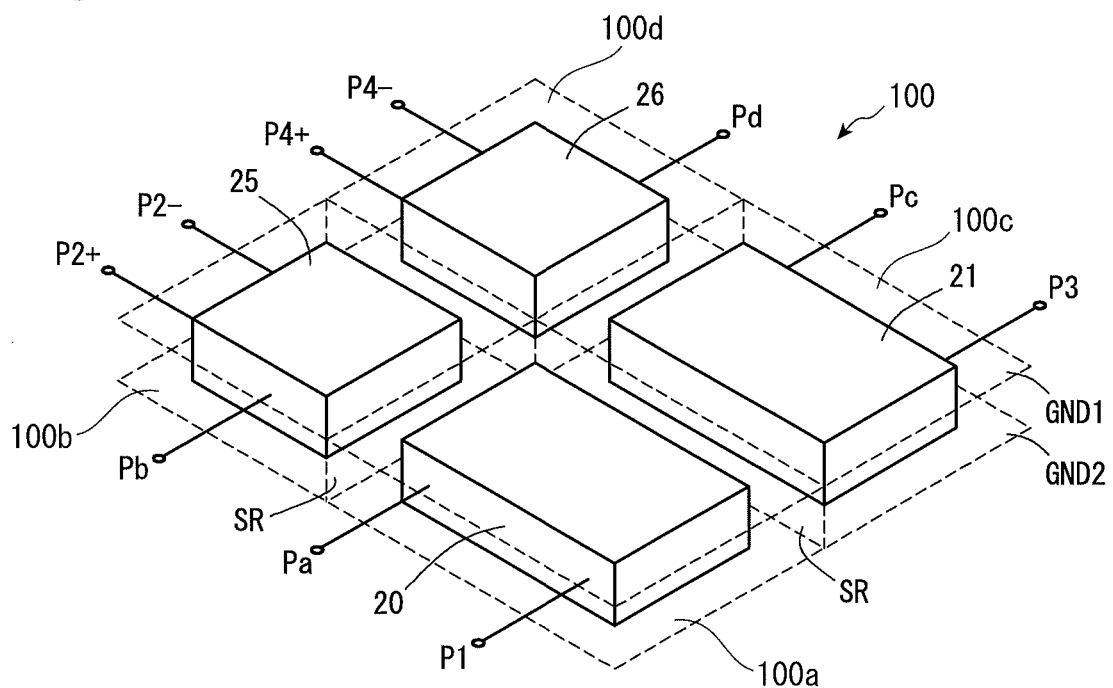
FIG. 10 is a perspective view showing one example of the arrangements of filters and baluns in a laminate constituting the electronic device according to another embodiment of the present invention.
Figure 11:
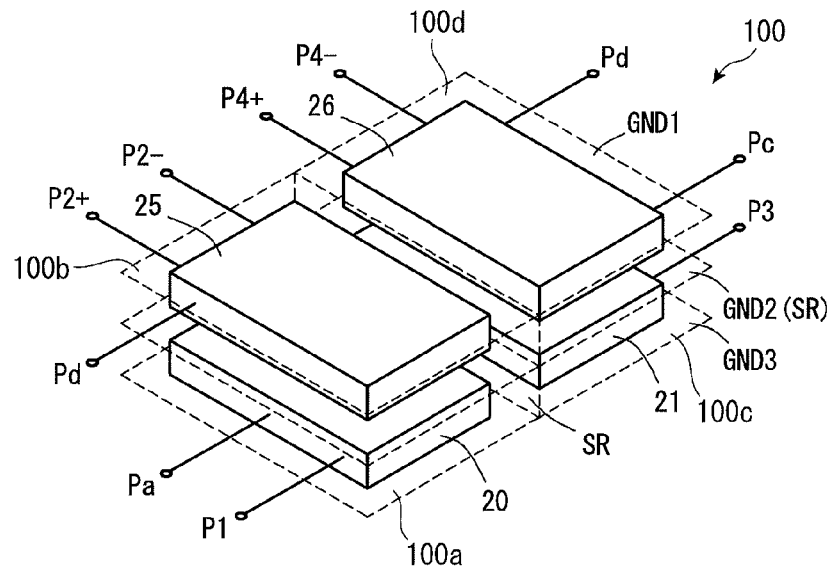
FIG. 11 is a perspective view showing a further example of the arrangements of filters and baluns in a laminate constituting the electronic device according to a further embodiment of the present invention.

In the example shown in FIG. 10, the filters 20, 21 and the baluns 25, 26 are arranged in four regions 100a-100d partitioned by two shields SR each constituted by via-holes in the laminate 100 without overlapping in a lamination direction. As shown in FIG. 11, however, a second shield SR may be constituted by via-holes connected to an upper-surface-side ground electrode GND1, a bottom-surface-side ground electrode GND3, and an intermediate ground electrode GND2 acting as the first shield SR, the first and second shields SR, SR, so that the filters 20, 21 and the baluns 25, 26 may be arranged in each of four regions 100a-100d obtained by partitioning the laminate 100 in plane and lamination directions.

Figure 12:
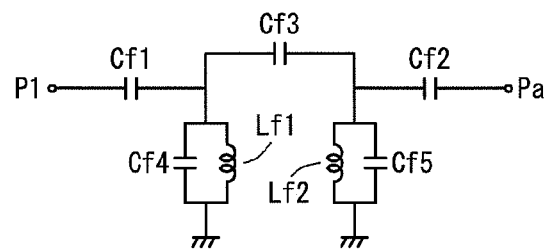
FIG. 12 is a view showing one example of filters used in the electronic device of the present invention.
Figure 13:
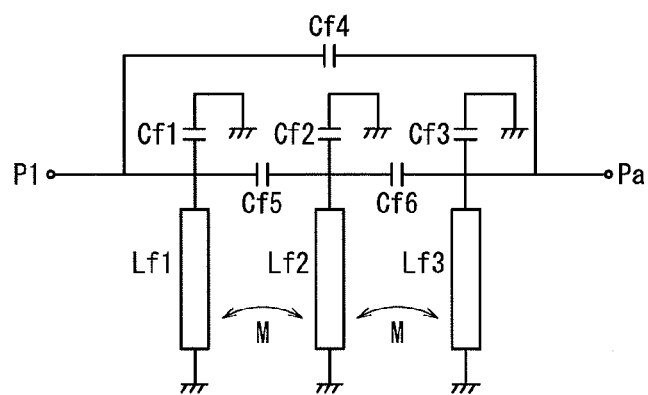
FIG. 13 is a view showing another example of filters used in the electronic device of the present invention.

The structures of the filters 20, 21 and the baluns 25, 26 used in the present invention are not particularly restricted, but may be known ones. FIGS. 12 and 13 show examples of the filter structures, and FIGS. 14-17 show examples of the balun structures. Though only bandpass filters are depicted, Lowpass filters may be used.

Figure 14:
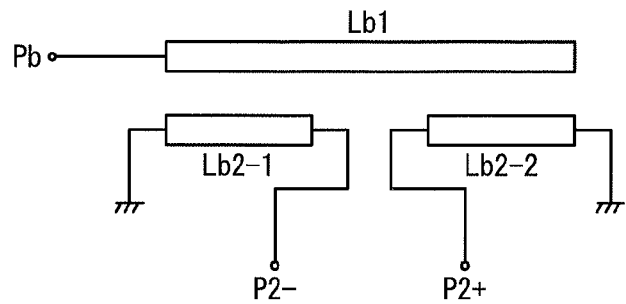
FIG. 14 is a view showing one example of baluns used in the electronic device of the present invention.

The balun shown in FIG. 14 is a so-called Marchand balun comprising a first line Lb1 of a ½ wavelength connected to the port Pb, a second line Lb2-1 of a ¼ wavelength coupled to the first line Lb1, and a third line Lb2-2 of a ¼ wavelength similarly coupled to the first line Lb1. The other end of the first line Lb1 is open. Each of the second and third lines Lb2-1, Lb2-2 has one end grounded, and the other end connected to the unbalanced port P2−, P2+.

Figure 15:
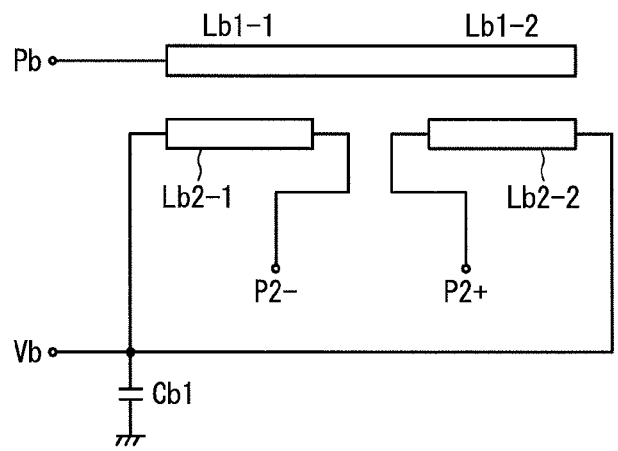
FIG. 15 is a view showing another example of baluns used in the electronic device of the present invention.

In the balun shown in FIG. 15, the connecting ends of the second line Lb2-1 and the third line Lb2-2 are grounded via a DC-cut capacitor Cb1, so that voltage can be applied from the port Vb.

Figure 16:
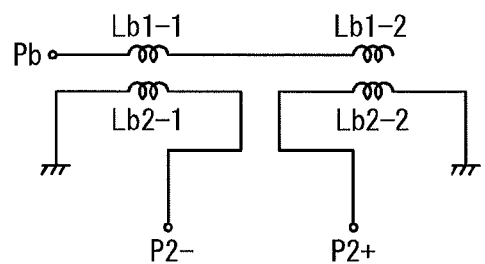
FIG. 16 is a view showing a further example of baluns used in the electronic device of the present invention.

The balun shown in FIG. 16 is obtained by changing the first line Lb1 in the Marchand balun to first and second coils Lb1-1, Lb1-2, and each of the second and third lines Lb2-1, Lb2-2 to third and fourth coils Lb2-1, Lb2-2.

Figure 17:
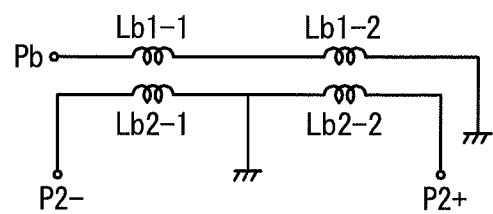
FIG. 17 is a view showing a still further example of baluns used in the electronic device of the present invention.

The balun shown in FIG. 17 comprises a first coil Lb1-1 connected to the port Pb, a second coil Lb1-2 having an end series-connected to the first coil Lb1-1 and another grounded end, a third coil Lb2-1 electromagnetically coupled to the first coil Lb1-1, and a fourth coil Lb2-2 electromagnetically coupled to the second coil Lb1-2. Each of the third and fourth coils Lb2-1, Lb2-2 has one end grounded, and the other end connected to the unbalanced port P2−, P2+.

Figure 18:
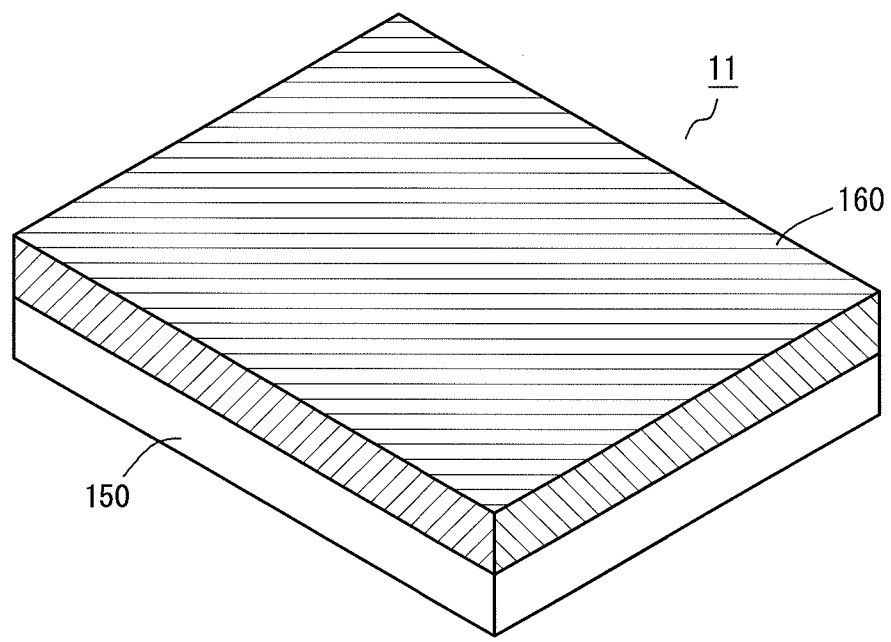
FIG. 18 is a perspective view showing the appearance of the electronic device according to another embodiment of the present invention.

FIG. 18 shows the appearance of an electronic device according to another embodiment of the present invention 1. This electronic device 1, which is used in a high-frequency transmission/reception circuit part in a wireless LAN apparatus, comprises a high-frequency amplifier, a low-noise amplifier and a high-frequency switch, together with pluralities of filters and baluns. Chip devices such as semiconductors used for the high-frequency amplifier, the low-noise amplifier, the high-frequency switch, etc., and capacitors, etc. not contained in a laminate 150 are mounted on the laminate 150 and sealed with a resin 160.

Figure 19:
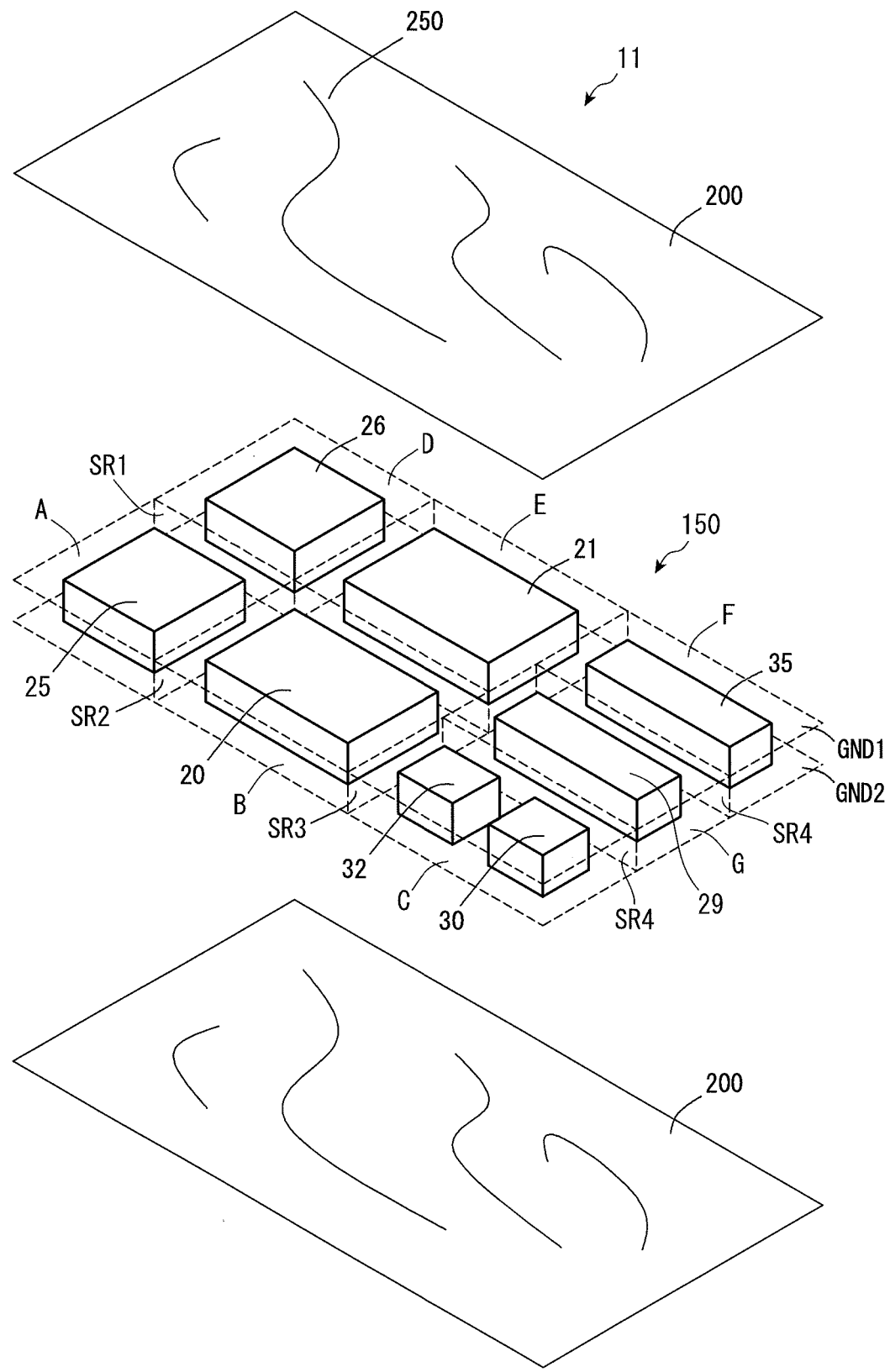
FIG. 19 is an exploded perspective view showing the arrangement of filters, baluns, etc. in a laminate constituting an electronic device according to a still further embodiment of the present invention.

FIG. 19 shows the arrangement of circuit devices such as filters, baluns, etc. in the electronic device 11 shown in FIG. 18. The inside of the laminate 150 constituting the electronic device 11 is partitioned in planar directions to pluralities of electromagnetically shielded regions by pluralities of ground electrodes GND1, GND2 at different lamination positions, and pluralities of shields SR1, SR2, SR3, SR4 electrically connected to the ground electrodes GND1, GND2. The filters 20, 21 and the baluns 25, 26 are arranged in four regions A, B, D, E, partitioned by the first and second shields SR1, SR2. A lowpass filter 32, a matching circuit 30, a bandpass filter 35, and a matching circuit 29 are arranged in three regions C, F, G partitioned by the third and fourth shields SR3, SR4. Lines 250 supplying power to the high-frequency amplifier, etc. are formed on an insulating layer 200 outside the ground electrodes GND1, GND2. With each region thus shielded, each circuit device is free from noises from other circuit devices.

FIG. 20 shows the equivalent circuit of the electronic device 11 shown in FIGS. 18 and 19. An antenna port Ant is connected to a single-pole, double-throw (SPDT) high-frequency switch 60 via a matching circuit 29, with the balun 25, the filter 20, a high-frequency amplifier 80, a lowpass filter 32 and a matching circuit 30 disposed in a pass for transmission signals, and the balun 26, the filter 21, a low-noise amplifier 85 and a bandpass filter 35 disposed in a pass a for reception signals. The high-frequency switch 60, the high-frequency amplifier 80 and the low-noise amplifier 85 are mounted on the laminate 150, and other circuits are formed by conductor patterns in the laminate 150. Some circuit devices such as a DC-cut capacitor, a matching circuit for the high-frequency amplifier 85, etc. are mounted on the laminate 150.

Figure 21:
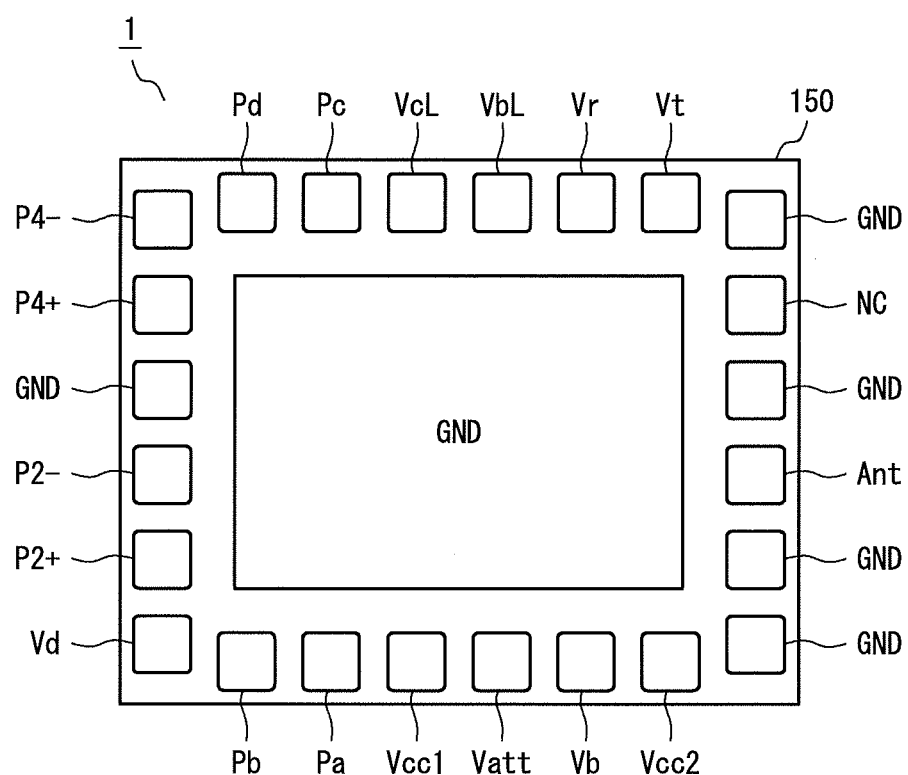
FIG. 21 is a bottom view showing the arrangement of terminal electrodes in a laminate constituting the electronic device shown in FIG. 19.

As shown in FIG. 21, pluralities of terminal electrodes are formed on a bottom surface of the laminate 150. Symbols attached to the terminal electrodes correspond to those attached to the ports of the equivalent circuit of the electronic device shown in FIG. 20. A ground pad GND connected through via-holes to ground electrodes on upper layers is formed in a center region of the bottom surface of the laminate 150, to give a stable ground potential, and to improve connection strength to the circuit board. Terminal electrodes arranged around the ground pad GND comprise pluralities of ground ports GND, an antenna port Ant and a non-contact port NC on a first side surface (on the right side in FIG. 21); voltage-applying terminals Vcc1, Vcc2, Vatt, Vb, the input port Pa of the filter 20, and the output port Pb of the balun 25 on a second side surface adjacent to the first side surface (on the lower side in FIG. 21); voltage-applying terminals VcL, VbL, Vr, Vt, the output port Pc of the filter 21, and the input port Pd of the balun 26 on a third side surface opposing the second side surface (on the upper side in FIG. 21); and a voltage-applying terminal Vd, a ground port GND, the input (balanced) ports P2+, P2− of the balun 25, and the output (balanced) ports P4+, P4− of the balun 26 on a fourth side surface (on the left side in FIG. 21).

Figure 22:
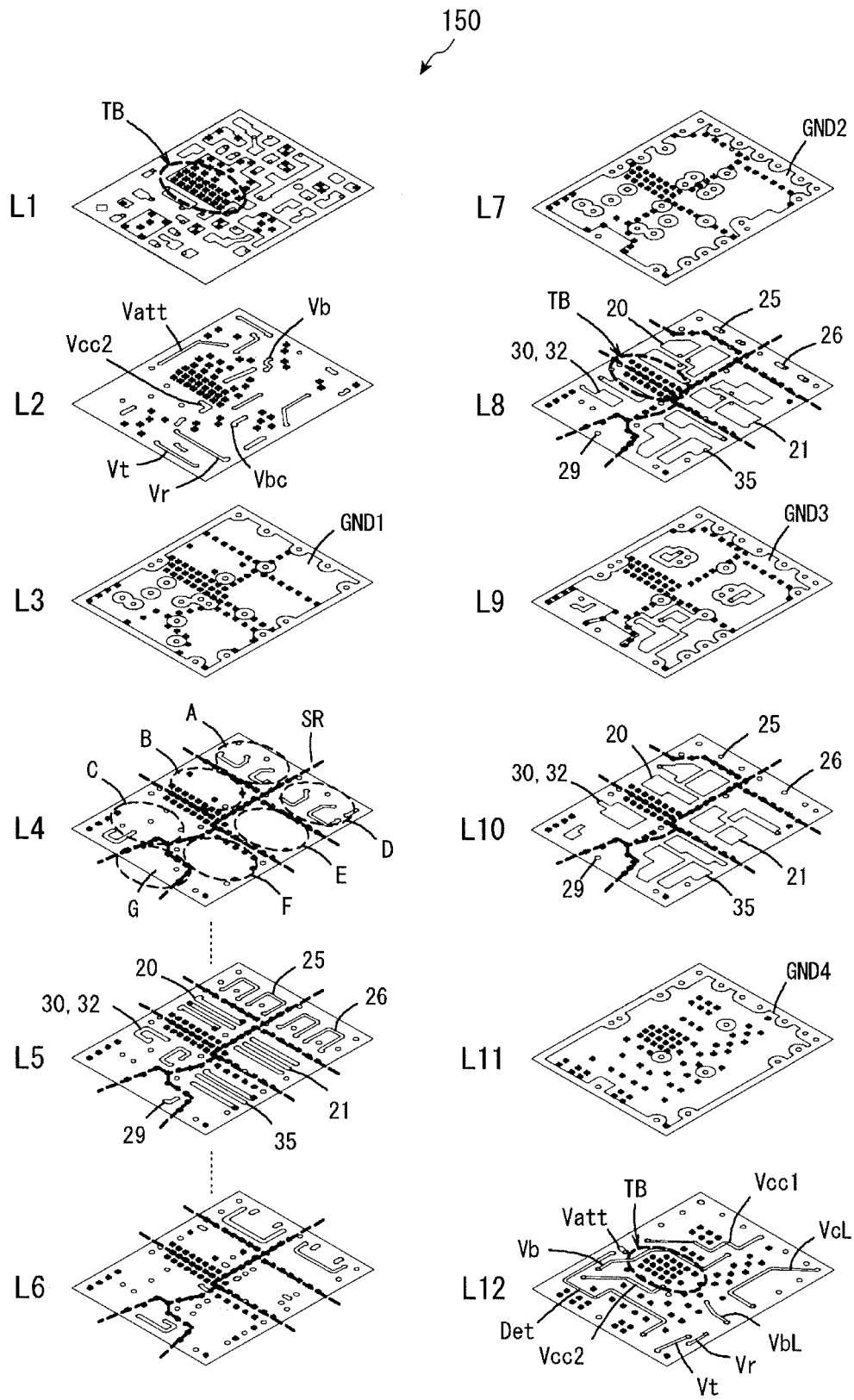
FIG. 22 is an exploded perspective view showing the internal structure of a laminate constituting the electronic device shown in FIG. 19.

FIG. 22 shows the internal structure of a laminate 150 for the electronic device 11 shown in FIGS. 18-21. The laminate 150 comprises 18 layers, though some of them are omitted in the figure. The laminate 150 is partitioned to seven regions A-G by pluralities of ground electrodes GND1-GND4 formed on different insulation layers L3, L7, L9, L11, and pluralities of shields SR electrically connected to the ground electrodes GND1-GND4. Conductor patterns for the first balun 25 are formed in the region A, conductor patterns for the first filter 20 are formed in the region B, conductor patterns for the lowpass filter 32 and the matching circuit 30 are formed in the region C, conductor patterns for the second balun 26 are formed in the region D, conductor patterns for the second filter 21 are formed in the region E, conductor patterns for the bandpass filter 35 are formed in the region F, and conductor patterns for the matching circuit 29 are formed in the region G.

Formed in the region B are thermal vias TB extending from the upper surface to the ground pad GND on the bottom surface in the laminate 150, and a semiconductor device for the high-frequency amplifier 80 is mounted in a portion corresponding to the region B on the upper surface of the laminate 150. The thermal vias TB are arranged concentratedly on the output side of the high-frequency amplifier 80, so that they are used as a shield SR between the region B and the region C. With such structure, even the laminate comprising pluralities of circuits can be miniaturized.

Pluralities of power supply lines 250 are concentratedly arranged on insulation layers L2, L12 outside the ground electrodes GND1, GND4, so that they are separated from conductor patterns constituting the circuit. To reduce interference between the power supply lines 250, via-holes connected to the ground electrodes are provided.

Figure 23:
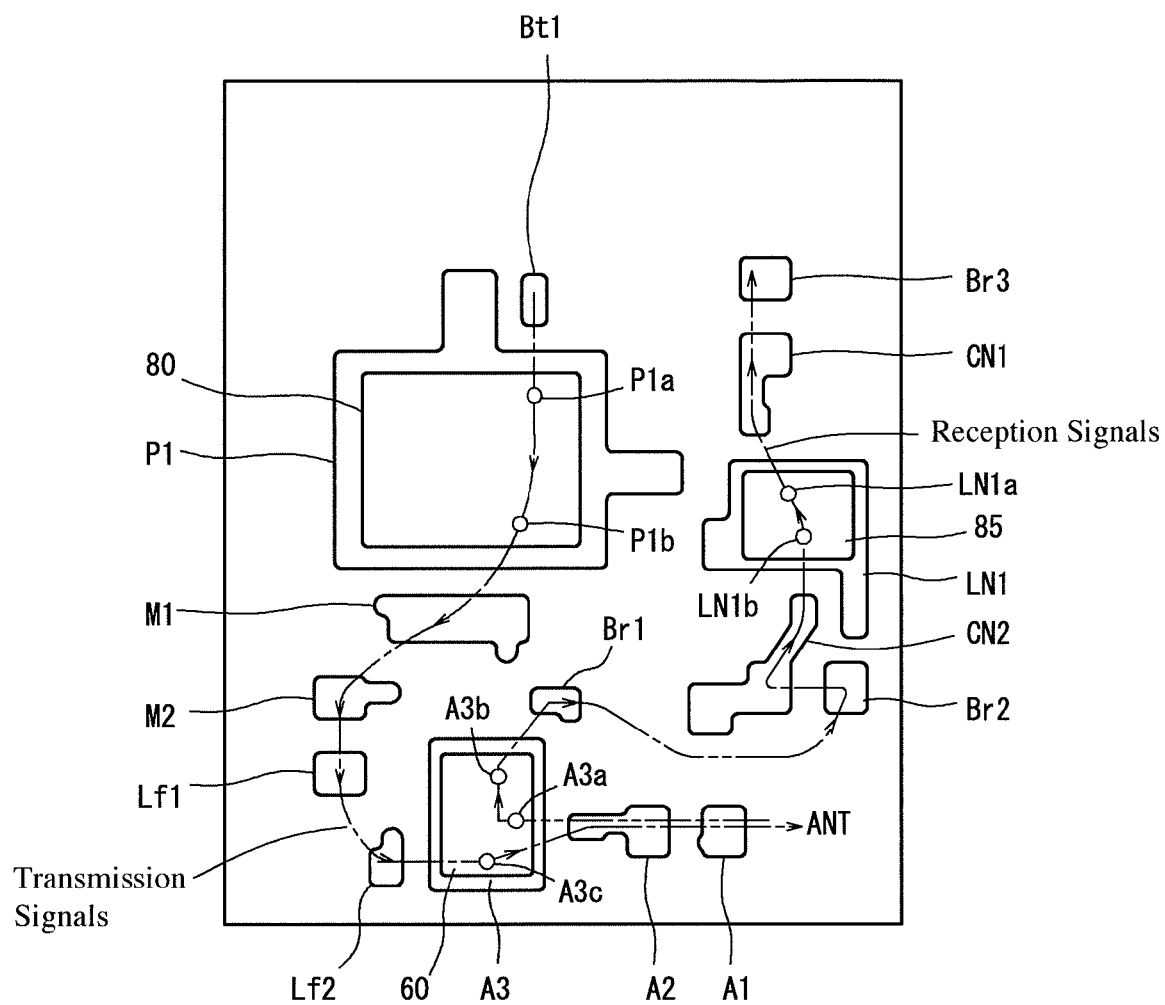
FIG. 23 is a view showing the passes of transmission signals and reception signals in the electronic device shown in FIG. 19.

FIG. 23 shows the arrangement of main terminal electrodes on an upper surface of the laminate. Symbols attached to terminal electrodes on the upper surface in FIG. 23 correspond to those attached to the ports of the equivalent circuit shown in FIG. 20. All of a port P2/Bt1 of the filter 20, a port P3/Br3 of the filter 21, a port A1 of the matching circuit 29, ports Lt1, Lt2 of the matching circuit 30, ports M1, M2 of the lowpass filter 32, and ports Br1, Br2 of the bandpass filter 35, which are formed by conductor patterns in the laminate, are connected to the terminal electrodes on the upper surface of the laminate. Semiconductor devices 60, 80, 85 such as chip parts, amplifiers, switches, etc., which are mounted on the laminate, are connected via bonding wires WB.

Figure 24A:
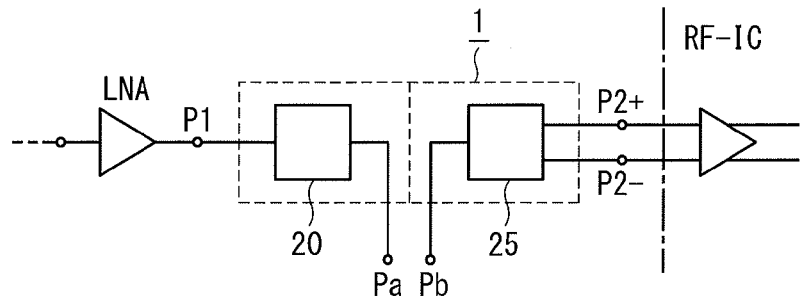
FIG. 24($a$) is a block diagram showing one example of the base structures of a high-frequency circuit comprising the electronic device of the present invention.

FIG. 24(a) shows a high-frequency circuit for 2.5-GHz-band WiMAX (WiBro) comprising the laminate-type electronic device 1 of the present invention. This laminate-type electronic device 1 comprises a filter 20 and a balun 25. The filter 20 is a bandpass filter having a passband of 2.3-2.7 GHz.

Figure 24B:
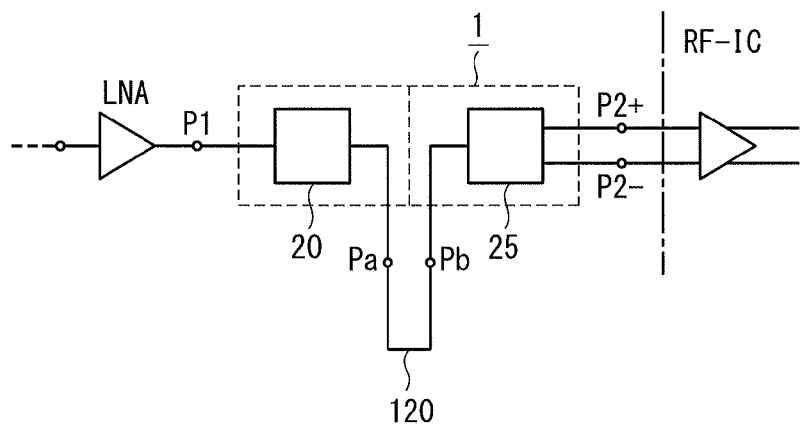
Figure 24C:
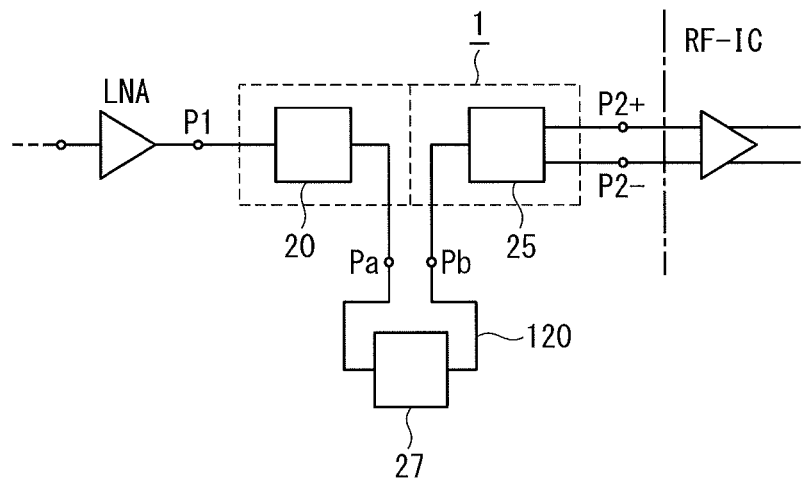
Figure 24D:
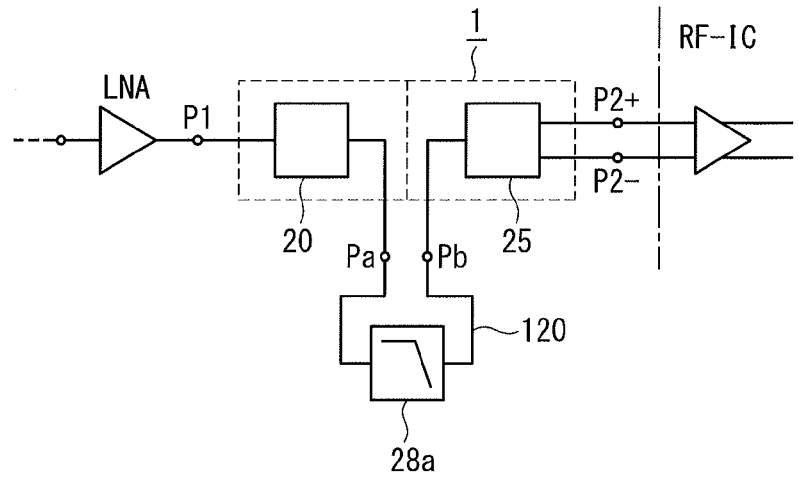
Figure 24E:
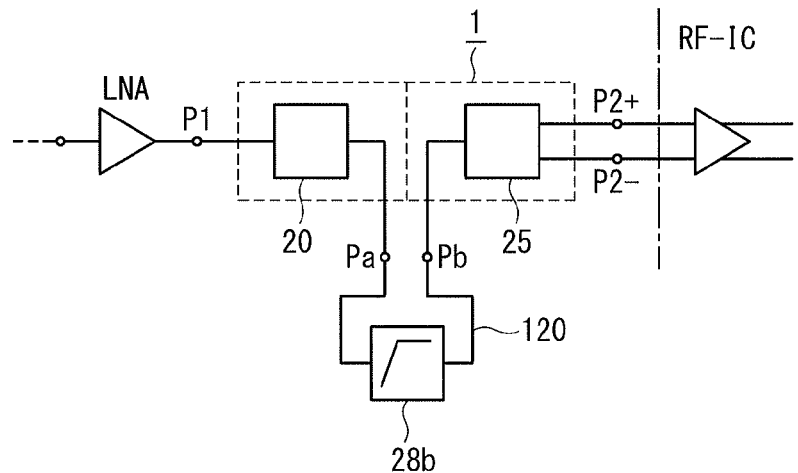
Figure 25:
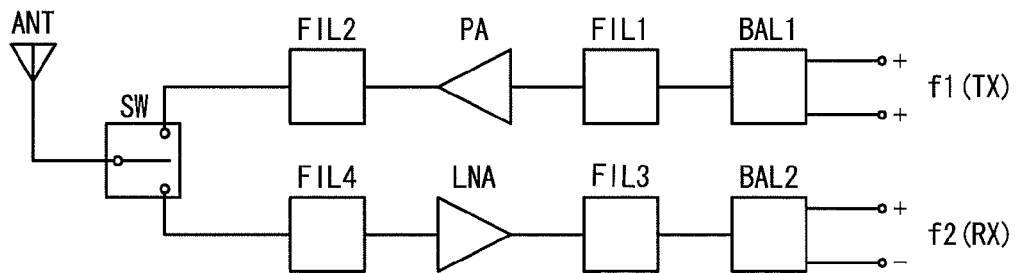
FIG. 25 is a block diagram showing one example of high-frequency circuits in a wireless communications apparatus.
Figure 26:
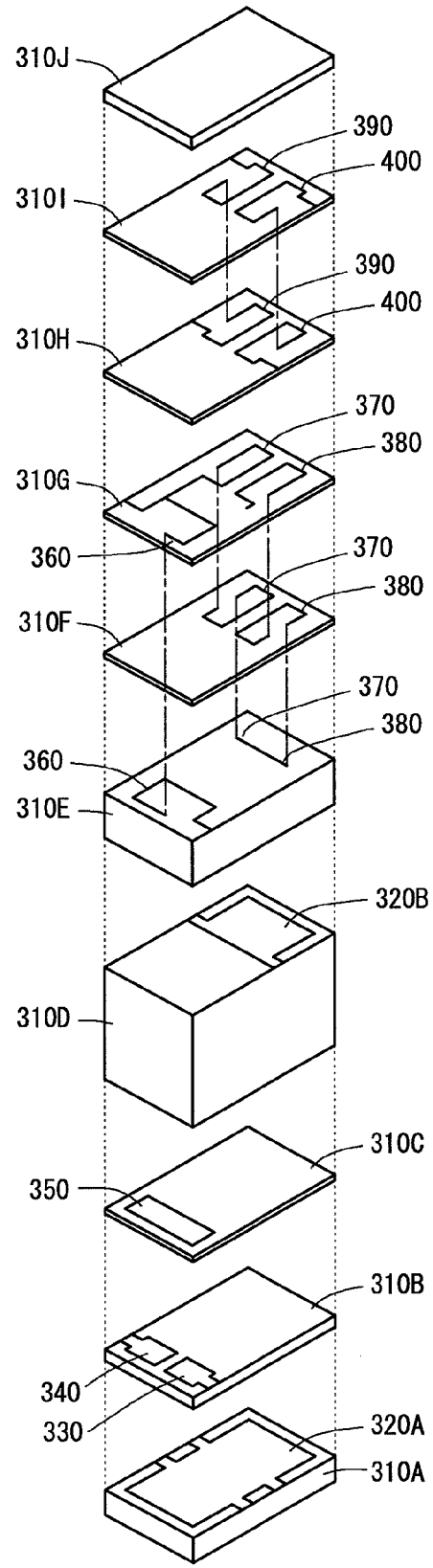
FIG. 26 is an exploded perspective view showing the internal structure of a conventional electronic device.

1. When this high-frequency circuit is used as a high-frequency circuit with a frequency band of 2.3-2.7 GHz, the terminal Pa of the filter 20 is short-circuited to the terminal Pb of the balun 25 as shown in FIG. 24(b), or a notch filter 27 for attenuating signals of 2.4-2.5 GHz is disposed between the terminal Pa and the terminal Pb as shown in FIG. 24(c).
2. When this high-frequency circuit is used for WiBro (Korea) of 2.3-2.4 GHz, a lowpass filter 28a for attenuating signals of higher than 2.4 GHz is disposed between the terminal Pa and the terminal Pb as shown in FIG. 24(d).
3. When this high-frequency circuit is used for WiMAX (Japan and the United States) of 2.5-2.7 GHz, a highpass filter 28b for attenuating signals of lower than 2.5 GHz is disposed between the terminal Pa and the terminal Pb as shown in FIG. 24(e).

As described above, because the laminate-type electronic device of the present invention comprises a filter 20 and a balun 25 not electrically connected in a laminate, it can be used as high-frequency circuits of various frequency bands with its terminals Pa and Pb connected to different external circuits mounted on an upper surface thereof. Therefore, various high-frequency circuits can be provided by fewer types of electronic devices with simplified design.

EFFECTS OF THE INVENTION

The present invention provides an electronic device having excellent electric characteristics, which can be used in various high-frequency circuits without interference between filters and baluns even when it is made smaller.

What is claimed is:
1. An electronic device comprising:
a laminate constituted by pluralities of insulation layers on which conductor patterns are formed;
a ground electrode being formed on each of an upper-surface-side insulation layer and a bottom-surface-side insulation layer in said laminate;
said laminate being partitioned to first and second regions in a lamination direction between said upper-surface-side ground electrode and said bottom-surface-side ground electrode, by a first shield constituted by a ground electrode formed on an insulation layer between the upper-surface-side ground electrode and the bottom-surface-side ground electrode;
first conductor patterns constituting a first filter for a first frequency band being arranged in said first region;
second conductor patterns constituting a first balun for the first frequency band being arranged in said second region;
first pluralities of terminal electrodes being formed on bottom or side surfaces of said laminate;
one of terminal electrodes of said first filter, which acts as an unbalanced port, being arranged adjacently to a terminal electrode of said first balun, which acts as an unbalanced port, with no other terminal electrode than a ground electrode existing therebetween;
said first filter and said first balun being not electrically connected in said laminate;

a second shield constituted by a line of via-holes formed in a lamination direction to electrically connect said upper-surface-side ground electrode, said bottom-surface-side ground electrode and said first shield;

said laminate being further partitioned by said first and second shields to first to fourth subregions in plane and lamination directions between said upper-surface-side ground electrode and said bottom-surface-side ground electrode;

the first conductor patterns constituting the first filter for the first frequency band being arranged in said first subregion;

the second conductor patterns constituting the first balun for the first frequency band being arranged in said second subregion, third conductor patterns constituting a second filter for a second frequency band being arranged in said third subregion;

fourth conductor patterns constituting a second balun for the second frequency band being arranged in said fourth subregion;

one of terminal electrodes of said second filter, which acts as an unbalanced port, being arranged adjacently to a terminal electrode of said second balun, which acts as an unbalanced port, with no other terminal electrode than a ground electrode existing therebetween; and said first filter, said first balun, said second filter and said second balun being not electrically connected in said laminate.

2. The electronic device according to claim 1, wherein second pluralities of terminal electrodes are formed on upper and bottom surfaces of said laminate, and wherein another unbalanced port of each of said first and second filters is connected to a terminal electrode on the upper or bottom surface.

3. The electronic device of claim 1, wherein the lamination direction crosses a plane of at least one of the insulation layers constituting the laminate.

* * * * *